United States Patent [19]

Nishimura et al.

[11] Patent Number: 5,441,194
[45] Date of Patent: Aug. 15, 1995

[54] THERMO-COMPRESSION ASSEMBLY/DISASSEMBLY SYSTEM FOR ELECTRIC CIRCUIT BOARD IN INERT AMBIENCE

[75] Inventors: Seiya Nishimura; Yoshihisa Maejima; Tokuyoshi Ohta, all of Shizuoka, Japan

[73] Assignee: Yamaha Corporation, Japan

[21] Appl. No.: 172,613

[22] Filed: Dec. 22, 1993

[30] Foreign Application Priority Data

Dec. 25, 1992 [JP] Japan .................................. 4-358977
Mar. 24, 1993 [JP] Japan .................................. 5-090881

[51] Int. Cl.⁶ ................................................ B23K 3/00
[52] U.S. Cl. ..................................... 228/6.2; 228/42; 228/44.7; 228/46
[58] Field of Search ................ 228/42, 46, 6.2, 230, 228/219, 264, 44.7

[56] References Cited

U.S. PATENT DOCUMENTS

| | | | |
|---|---|---|---|
| 5,033,665 | 7/1991 | Todd | 228/103 |
| 5,094,381 | 3/1992 | Amos et al. | 228/42 |
| 5,139,193 | 8/1992 | Todd | 228/42 |
| 5,152,447 | 10/1992 | Wallgren et al. | 228/6.2 |

FOREIGN PATENT DOCUMENTS 4-53118  8/1992  Japan .
5-50220  3/1993  Japan .

Primary Examiner—Mark Rosenbaum
Assistant Examiner—Jeanne M. Elpel
Attorney, Agent, or Firm—Ostrolenk, Faber, Gerb & Soffen

[57] ABSTRACT

A thermo-compression tool incorproated in an assembly/disassembly system melts solder films of conductive leads of an electric circuit componet for bonding the conductive leads to pads of a circuit board, and nozzles blow high-temperature nitrogen gas to the conductive leads during the bonding work for preventing the solder films from oxidization.

1 Claim, 8 Drawing Sheets

THERMO-COMPRESSION ASSEMBLY/DISASSEMBLY SYSTEM FOR ELECTRIC CIRCUIT BOARD IN INERT AMBIENCE

FIELD OF THE INVENTION

This invention relates to a thermo-compression assembly/disassembly system and, more particularly, to a thermo-compression assembly/disassembly system for an electric/electronic circuit board in inert ambience.

DESCRIPTION OF THE RELATED ART

The thermo-compression assembly/disassembly system is available for assembling and disassembling an electric/ electronic circuit board, and circuit components such as, for example, a small outline package, a mini-square package and a quad flat package are bonded onto or recovered from a rigid circuit board.

A movable thermo-compression tool, a quench-nozzle and a recovering tool are incorporated in the thermo-compression assembly/disassembly system, and are spaced apart from one another in a working area of the system. Namely, the thermo-compression tool, the quench nozzle and the recovering tool are assigned to a first working sub-area, a second working sub-area spaced apart from the first working sub-area and a third working sub-area spaced apart from the first and second working sub-areas. The thermo-compression tool is heated to a certain temperature high enough to melt solder. On the other hand, copper pads are patterned on a surface of a rigid circuit board, and conductive leads of a semiconductor integrated circuit package are partially coated with the solder, by way of example.

First, the semiconductor integrated circuit package is mounted on the surface of the rigid circuit board, and the conductive leads are aligned with the copper pads. The semiconductor integrated circuit package mounted on the rigid circuit board is conveyed to the first the working sub-area, and the thermo-compression tool presses the conductive leads against the copper pads. Then, the solder is melted, and the conductive leads are bonded to the copper pads. The semiconductor integrated circuit package is, thereafter, conveyed to the second working sub-area, and quench air at room temperature is blown to the semiconductor integrated circuit package. As a result, the melted solder is set, and the semiconductor integrated circuit board is fixed to the rigid circuit board.

When a semiconductor integrated circuit device is recovered from an electric/electronic circuit board, the electric/electronic circuit board is conveyed to the first working sub-area, and the thermo-compression tool is pressed against the semiconductor integrated circuit device so that the solder is melted again. The electric/electronic circuit board is conveyed to the third working sub-area, and a suitable recovering tool such as a vacuum pincette pulls up the semiconductor integrated circuit package for recovering the semiconductor integrated circuit package from the electric/electronic circuit board.

The prior art thermo-compression assembly/disassembly system thus arranged encounters a problem in that the thermo-compression bonding consumes long time, and the throughput of the prior art thermo-compression assembly/disassembly system is low. This is because of the fact that the semiconductor integrated circuit package on the board is required to travel from the first working sub-area to the second working sub-area.

Another problem inherent in the prior art thermo-compression assembly/disassembly system is undesirable oxidation of the solder. Namely, the quench air oxidizes the solder, and the conductive leads are liable to peel from the copper pads. In order to prevent the solder from the oxidation, it is necessary for a manufacturer to mix an antioxidant into the solder, and the solder containing the antioxidant is uneconomical.

The prior art thermo-compression assembly/disassembly system further encounters yet another problem in that the semiconductor integrated circuit package tends to be broken while being recovered from the electric/electronic circuit board. The reason for the breakage is partial setting of the solder between the thermo-compression and the recovery with the vacuum pincette.

SUMMARY OF THE INVENTION

It is therefore an important object of the present invention to provide a thermo-compression assembly/-disassembly system which is free from the problems inherent in the prior art thermo-compression assembly/disassembly system.

To accomplish the object, the present invention proposes to selectively blow high temperature inert gas and low temperature inert gas to a thermally fusible substance.

In accordance with one aspect of the present invention, there is provided a thermo-compression system, comprising: a) a working region where at least one conductive pad of a circuit board is held in contact with at least one conductive lead of an electric circuit component coated with a thermally fusible substance; b) a thermo-compression tool movable into and outof the working region for applying heat and pressure to the at least one conductive lead, thereby fusing the thermal fusible substance; c) a nozzle means blowing an inert gas to the at least one conductive pad and the at least one conductive lead in the working region; d) a heating means for heating the inert gas over a melting point of the thermal fusible substance.

In accordance with another aspect of the present invention, there is provided a thermo-compression system comprising: a) a working region where at least one conductive pad of a circuit board is held in contact with at least one conductive lead of an electric circuit component coated with a thermally fusible substance; b) a nozzle means blowing gas to the at least one conductive pad and the at least one conductive lead in the working region; c) a heating means for heating the gas over a melting point of the thermal fusible substance so that the nozzle means blows a high-temperature gas to the at least one conductive pad and the at least one conductive lead; and d) holding means for conveying the electric circuit component between the circuit board in the working region and the outside of the working region.

BRIEF DESCRIPTION OF THE DRAWINGS

The features and advantages of the thermo-compression assembly/disassembly system according to the present invention will be more clearly understood from the following description taken in conjunction with the accompanying drawings in which.

DESCRIPTION OF THE PREFERRED EMBODIMENTS

First Embodiment

Figure 1:
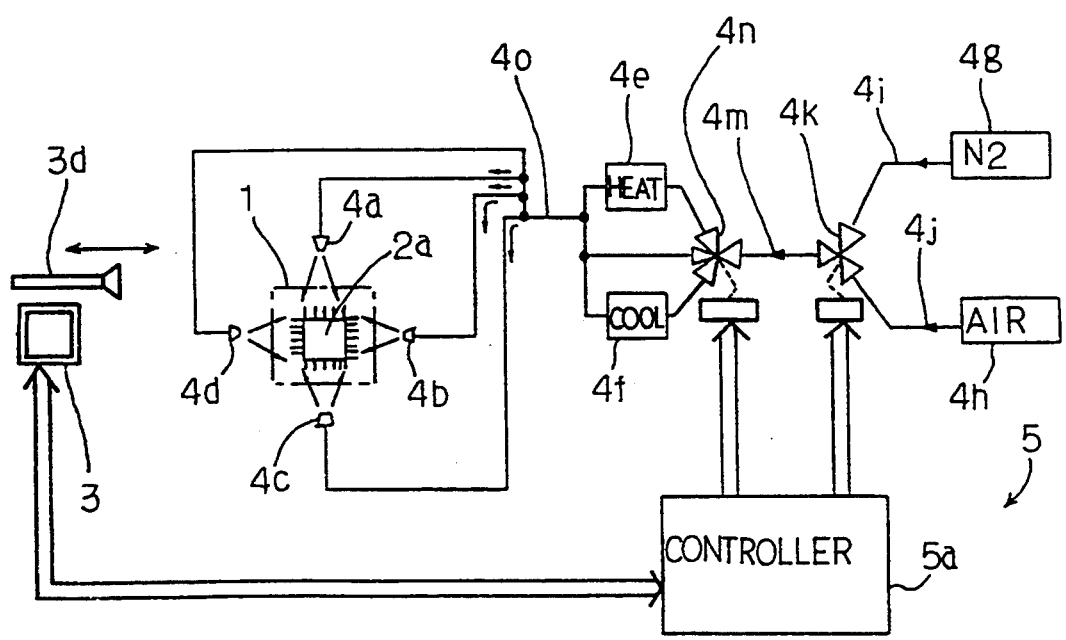
FIG. 1 is a diagram showing the arrangement of a thermo-compression assembly/disassembly system according to the present invention.

Referring first to FIG. 1 of the drawings, a thermo-compression assembly/disassembly system embodying the present invention comprises a working region 1, and a semiconductor integrated circuit package 2a is mounted on a rigid circuit board 2b conveyed to and from the working region 1. A plurality of conductive leads 2c projects from the periphery of the semiconductor integrated circuit package 2a, and are partially coated with solder. The solder is either hard or soft solder. The rigid circuit board 2b has copper pads 2d, and the plurality of conductive leads 2c are held in contact with the copper pads 2d. In this instance, any antioxidant is not mixed into the solder, and, for this reason, the wettability of the solder is better than that of a solder containing an antioxidant. The thickness of the solder films is variable depending upon the pitch of the conductive leads 2c. For example, if the pitch of the conductive leads 2c is changed from 0.3 millimeter through 0.5 millimeter to 0.8 millimeter, the thickness of the solder films varies from 25 microns through 38 microns to 60 microns.

The thermo-compression assembly/disassembly system further comprises a thermo-compression tool 3, and is provided over the working region 1. Though not shown in the drawings, a driving mechanism is associated with the thermo-compression tool 3, and moves the thermo-compression tool 3 into and outof the working region 1. The thermo-compression tool 3 has a generally square configuration, and is slightly larger than the semiconductor integrated circuit package 2a. A heating member is embedded into the generally square frame 3a, and a thermo-couple 3b monitors the generally square frame 3a to see whether or not the temperature exceeds the melting point of the solder.

When the thermo-compression tool 3 is moved into the working region 1, the semiconductor integrated circuit package 2a and, accordingly, the plurality of conductive leads 2c are pressed against the copper pads 2d. While the thermo-compression tool is pressing the plurality of conductive leads 2c against the copper pads 2d, the generally square frame 3a heats the solder over the melting point thereof, and the solder is fused.

Holding means, such as a vacuum pincette 3d is further incorporated in the thermo-compression assembly/disassembly system, and is also movable into and outof the working region 1. Though not shown in the drawings, the vacuum pincette 3d is connected to a suitable vacuum source, and absorbs the semiconductor integrated circuit package 2a in the working region 1.

The thermo-compression assembly/disassembly system further comprises a plurality of nozzles 4a, 4b, 4c and 4d, and the plurality of nozzles 4a to 4d are provided over the working region 1. In this instance, the plurality of nozzles 4a to 4d are angularly spaced apart from one another, and are directed to the conductive leads 2c on the copper pads 2d. Each of the nozzles 4a to 4d can focus a gas flow on a line of conductive leads 2c, and the four nozzles 4a to 4d covers the four lines of conductive leads 2c with the nitrogen gas, the air or the gaseous mixture. This feature is desirable because of the consumption of gas. However, each gas flow may be focused on each conductive lead 2c, and a relative motion between each nozzle and the working region 1 may sequentially concentrate the gas flow onto each of the conductive leads 2c.

The thermo-compression assembly/disassembly system further comprises a heating unit 4e, a cooling unit 4f, a source of nitrogen gas 4g and a source of air 4h. The source of nitrogen gas 4g and the source of air 4h are connected through gas passages 4i and 4j with two inputs of a valve unit 4k, and the output of the valve unit 4k is connected through a gas passage 4m with an input node of another valve unit 4n. The valve unit 4n has three outputs respectively connected with the heating unit 4e, a gas distribution network 4o and the cooling unit 4f, and the heating unit 4e and the cooling unit 4f in turn are connected with the gas distribution network 4o. The nozzles 4a to 4d are detachably connected with the gas distribution network 4o, and the value units 4k and 4n supply one of the nitrogen gas, the air and the gaseous mixture thereof directly to or through the heating or cooling unit 4e or 4f to the gas distribution network 4o.

The nitrogen gas and the air are maintained in the sources 4g and 4h at room temperature. The heating unit 4e heats the nitrogen gas, the air and the gaseous mixture over the melting point of the solder. On the other hand, the cooling unit 4f is, by way of example, implemented by a heat exchanger, and cools down the nitrogen gas, the air and the gaseous mixture below the melting point or the room temperature. The heating unit 4e and the cooling unit 4f may change the target temperatures.

A controlling sub-system 5 is further incorporated in the thermo-compression assembly/disassembly system, and comprises a controller 5a implemented by a computer system. The controller 5a is electrically connected with the thermo-couple 3b, the heating member embedded in the generally square frame 3a, the driving mechanism (not shown) for the thermo-compression tool 3, a driving mechanism (not shown) for the vacuum pincette 3d, actuators of the valve units 4k and 4n, and changes the position of the thermo-compression tool 3, the position of the vacuum pincette 3d, the temperature of the thermo-compression tool 3 and the interconnections of the valve units 4k and 4n.

The thermo-compression assembly/disassembly system carries out various assembly/disassembly works listed hereinbelow. Table 1 summarizes assembly works, and Table 2 shows disassembly works.

TABLE 1

| No. | Melt of Solder ||||  Set of Solder Quench ||
|---|---|---|---|---|---|---|
| | Tool Position | Tool Temp. | Gas Temp. | Heating Gas | Quench Gas | Gas Temp. |
| 1 | contact | high | room | N2 | N2 | room |
| 2 | " | " | " | " | " | low |
| 3 | " | " | " | " | air | room |
| 4 | " | " | " | " | " | low |
| 5 | " | " | high | " | N2 | room |
| 6 | " | " | " | " | N2 | low |
| 7 | " | " | " | " | air | room |
| 8 | " | " | " | " | " | low |
| 9 | " | " | " | air | N2 | room |
| 10 | " | " | " | " | " | low |
| 11 | " | " | " | air | air | room |
| 12 | " | " | " | " | " | low |
| 13 | " | room | high | N2 | N2 | room |
| 14 | " | " | " | " | " | low |
| 15 | " | " | " | " | air | room |
| 16 | " | " | " | " | " | low |
| 17 | " | " | " | air | N2 | room |
| 18 | " | " | " | " | " | low |
| 19 | " | " | " | " | N2 | room |
| 20 | " | " | " | " | air | low |
| 21 | spaced | — | " | N2 | N2 | room |
| 22 | " | — | " | " | " | low |
| 23 | " | — | " | " | air | room |
| 24 | " | — | " | " | " | low |
| 25 | " | — | " | air | N2 | room |
| 26 | " | — | " | " | " | low |
| 27 | " | — | " | " | air | room |
| 28 | " | — | " | " | " | low |
| 29 | contact | high | — | — | N2 | room |
| 30 | " | " | — | — | " | low |
| 31 | " | " | — | — | air | room |
| 32 | " | " | — | — | " | low |

TABLE 2

| No. | Tool Position | Tool Temperature | Gas |
|---|---|---|---|
| I | contact | high | — |
| II | " | " | N2 |
| III | " | " | air |
| IV | — | — | N2 |
| V | — | — | air |

Figure 3:
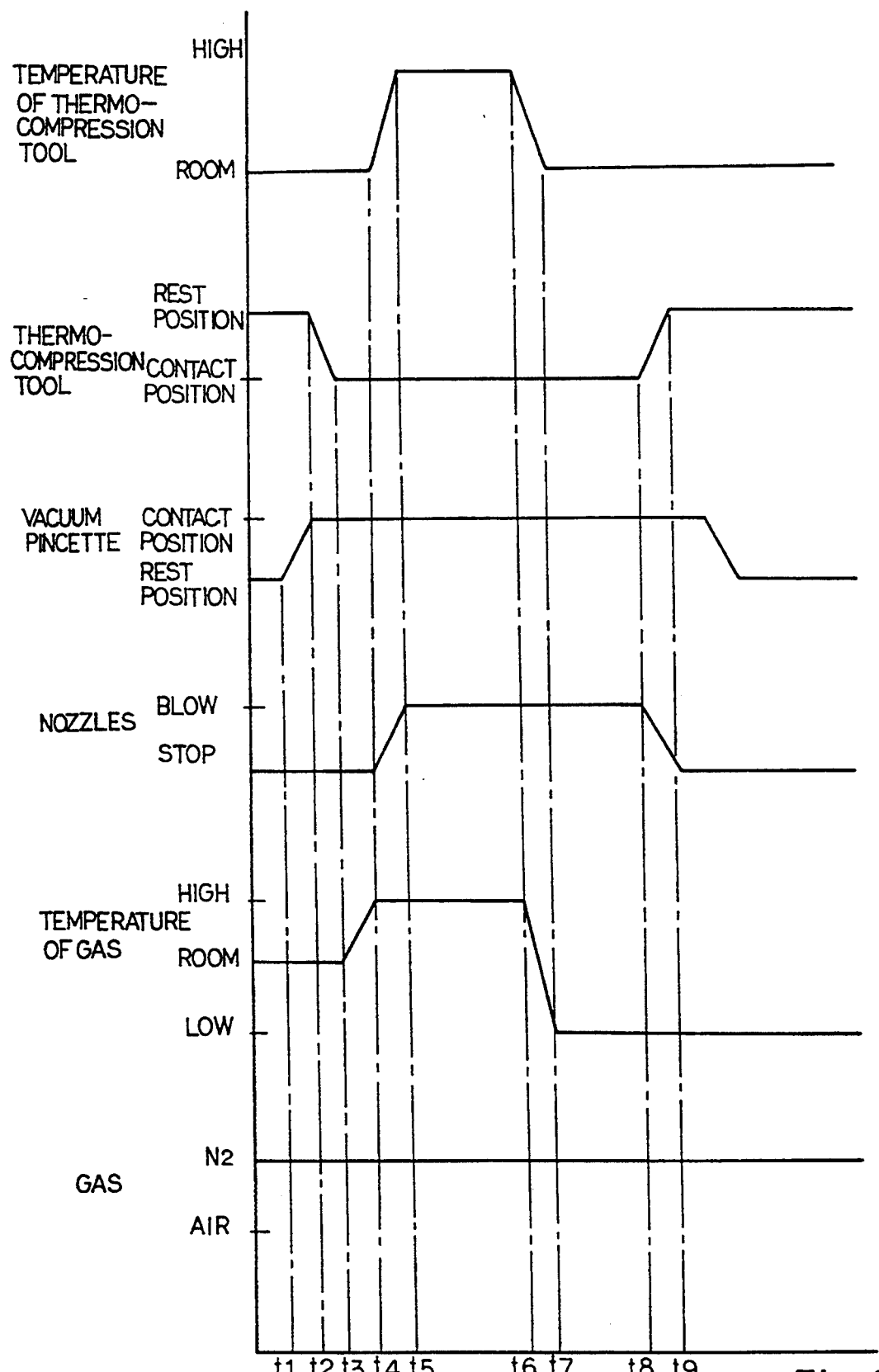
FIG. 3 is a timing chart showing an assembling sequence of the thermo-compression assembly/disassembly system according to the present invention.

Description is made on an assembling work in Mode No. 6 on the semiconductor integrated circuit package 2a with reference to FIG. 3 of the drawings, and the tool 3 is temporally heated. In the following description, term "rest position" is indicative of the location spaced apart from the working region 1, and term "contact position" means that either thermo-compression tool 3 or vacuum pincette 3d is held in contact with the semiconductor integrated circuit package 2a.

Assuming now that the rigid circuit board 2b reaches the working region 1, the controller 5a instructs the driving mechanism to downwardly move the vacuum pincette 3d holding the semiconductor integrated circuit package 2a at time t1, and the semiconductor integrated circuit package 2a is mounted on the rigid circuit board 2b in such a manner as to align the conductive leads 2c with the copper pads 2d at time t2.

For the assembling work, nitrogen gas is available, and the controller 5a instructs the valve unit 4k to interconnect the source of nitrogen gas 4g and the passage 4m.

Figure 4:
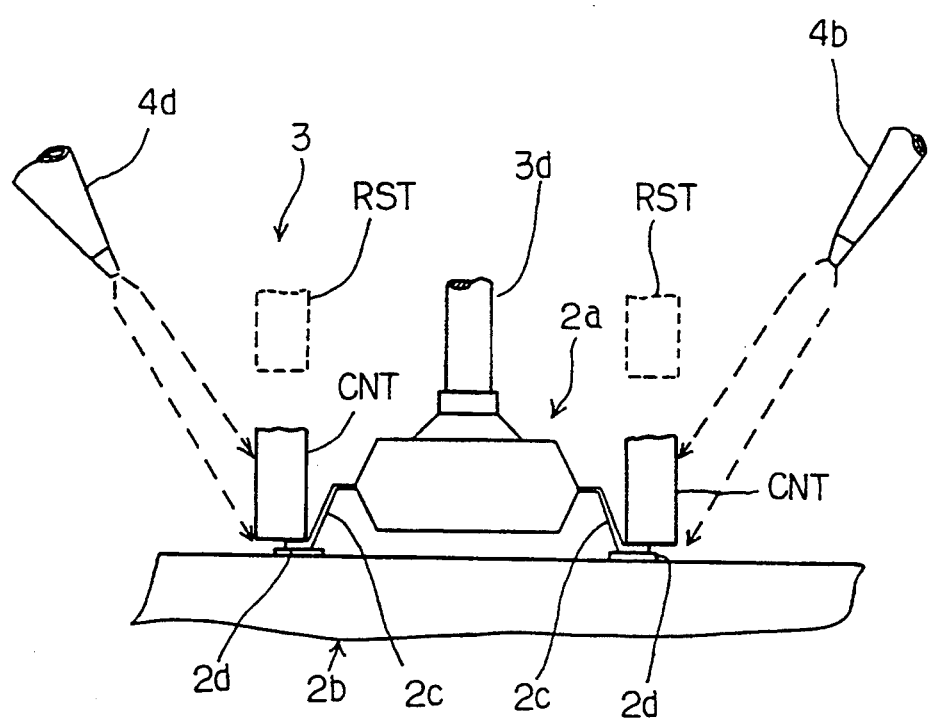
FIG. 4 is a front view showing a thermo-compression tool moved into a contact position.

The controller 5a instructs the driving mechanism to downwardly move the thermo-compression tool 3 from the rest position RST to the contact position CNT at time t2, and the thermo-compression tool 3 is brought into contact with the upper surfaces of the conductive leads 2c as shown in FIG. 4 at time t3.

The thermo-compression tool 3 keeps the contact position CNT from time t3 to time t8, and the controller 5a instructs the valve unit 4n to the heating unit 4e at time t3. Then, the nitrogen gas is supplied from the source of nitrogen 4g through the valve units 4k and 4n to the heating unit 4e, and rises from the room temperature to a certain temperature over the melting point of the solder. In this instance, the thermo-couple 3b reports the certain temperature to the controller 5a at time t4.

Then, the controller 5a instructs the nozzles 4a to 4d to blow the high-temperature nitrogen gas to the conductive leads 2c, and further instructs the heating unit of the thermo-compression tool 3 to increase the temperature at time t4. The thermo-compression tool 3 reaches the high temperature at time t5, and heats the conductive leads 2c over the melting point of the solder.

The high temperature nitrogen gas accelerates the melt of the solder, and the solder is perfectly melted until time t6. However, the velocity of the nitrogen gas is low, and the nitrogen gas does not scatter the melted solder.

Subsequently, the controller 5a instructs the valve unit 4n to supply the nitrogen gas to the cooling unit 4f, and the nitrogen gas blown to the conductive leads 2c is cooled down below the room temperature at time t7. The low-temperature nitrogen gas is also controlled not to scatter the melted solder. Concurrently, the controller 5a stops the thermo-compression tool 3 to heat the conductive leads 2c.

As a result, the termo-compression tool 3 is cooled from the high temperature to the room temperature, and reaches the room temperature at time time t7. The solder is rapidly set, and bonds the conductive leads 2c to the copper pads 2d until time t8.

The controller 5a instructs the valve unit 4k to stop the nitrogen gas at time t9, and further instructs the driving mechanism to move the thermo-compression tool 3 from the contact position to the rest position.

In this instance, the nitrogen gas is cooled under the room temperature. However, the nitrogen gas at the room temperature is blown to the conductive leads 2c in Mode No. 5, and the air at either room or low temperature is available for quenching the melted solder in Mode No. 7 or 8.

The gaseous mixture of the nitrogen gas and the air may be blown to the conductive leads after the solder is set.

As will be understood from the foregoing description, the soldering is carried out in the inert ambience, and the solder is not oxidized without antioxidant. Moreover, the high-temperature nitrogen gas and the low-temperature nitrogen gas rapidly melts and sets the solder at the working area, and the assembling work is completed within relatively short time period. This results in improvement of the throughput.

Figure 5:
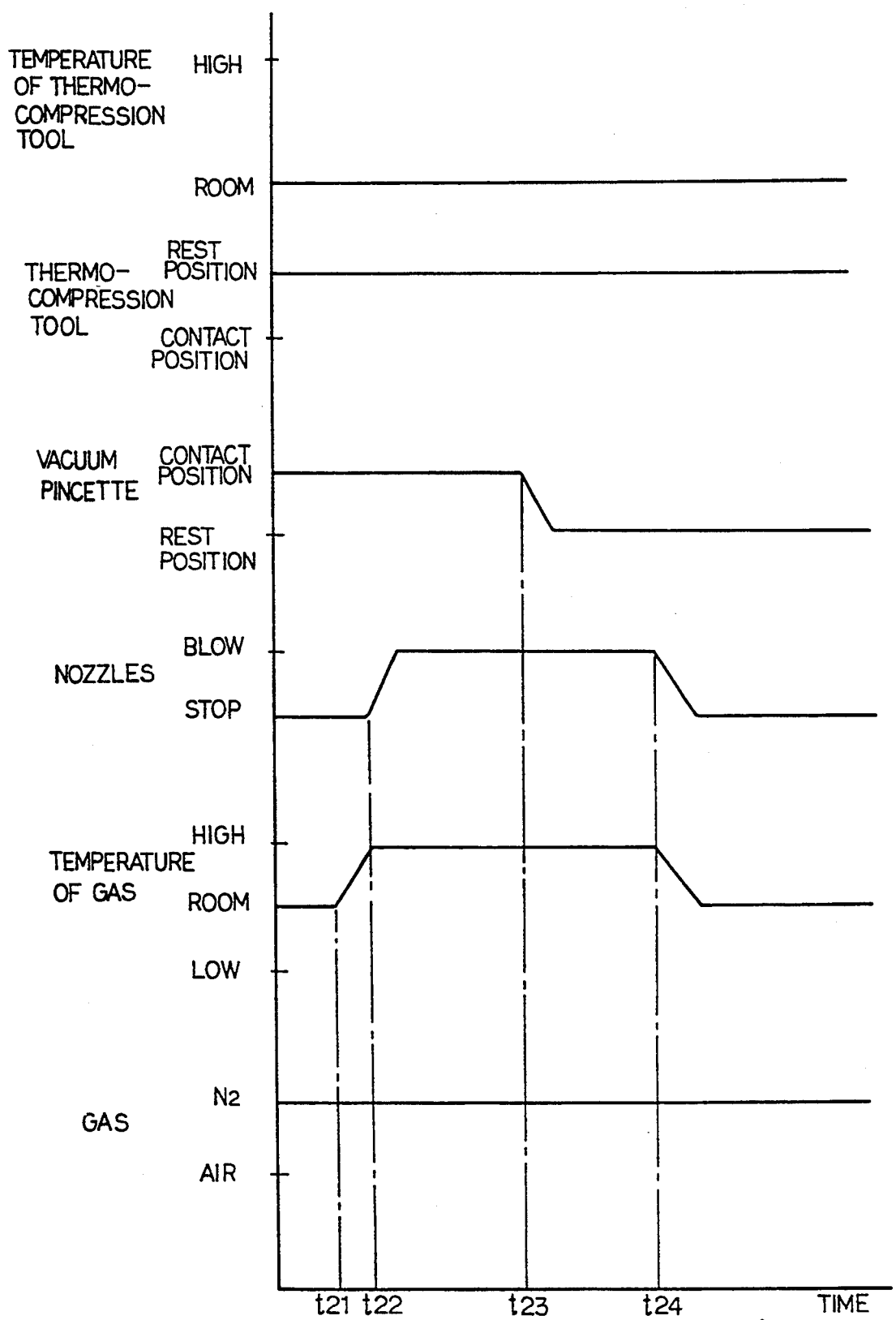
FIG. 5 is a timing chart showing a disassembling sequence of the thermo-compression assembly/disassembly system according to the present invention.

Turning to FIG. 5 of the drawings, a disassembling work starts with entry of an electric/electronic circuit board into the working region 1, and the vacuum pincette 3d is absorbed to the semiconductor integrated circuit package 2a. However, the thermo-compression tool 3 stands idle during the disassembling work, and is kept at room temperature.

The controller 5a instructs the valve unit 4n to conduct the source of nitrogen 4g through the valve unit 4k to the heating unit 4e at time t21, and the heating unit 4e heats the nitrogen gas.

If the nitrogen gas is heated over the melting point of the solder at time t22, the controller 5a instructs the nozzles 4a to 4d to blow the high-temperature nitrogen gas to the conductive leads 2c bonded to the copper pads 2d, and the solder is melted.

When the solder is melted, the controller 5a instructs the driving mechanism to lift the vacuum pincette 3d at time t23, and the melted solder allows the vacuum pincette 3d to separate the semiconductor integrated circuit package 2a from the electric/electronic circuit board 2b. While the vacuum pincette 3d is separating the semiconductor integrated circuit package 2a from the electric/electronic circuit board, the nozzles 4a to 4d are continuously blowing the high-temperature nitrogen gas to the copper pads 2d, and the solder is never set again. As a result, the conductive leads 2c and the copper pads 2d are not broken, and the semiconductor integrated circuit package 2a and the rigid circuit board 2b can be reused, if necessary. Of course, in order to use the semiconductor integrated circuit package 2a again, solder may be supplemented between the conductive leads 2c and the copper pads 2d. However, the residual solder is not oxidized in the disassembling work, and the melted solder keeps the wettability.

Finally, the controller 5a instructs the valve units 4k and 4n to block the passage from the source of nitrogen gas 4g to the heating unit 4e.

In this instance, the high-temperature nitrogen gas is used in the disassembling work, and the disassembling work is Mode IV. However, the air or the gaseous mixture of the nitrogen gas and the air is available by controlling the valve units 4k and 4n in Mode V.

Figure 6:
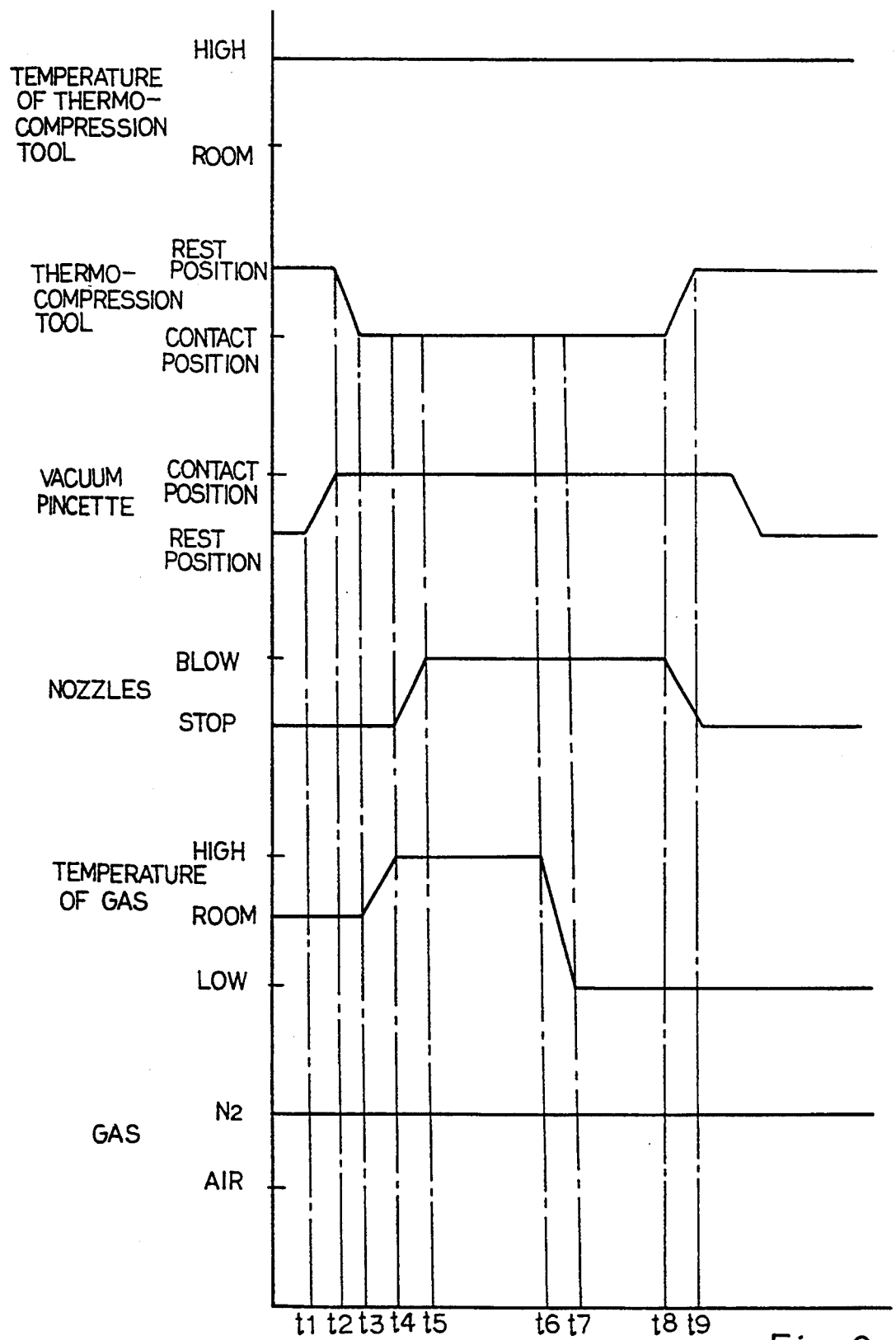
FIG. 6 is a timing chart showing an assembling sequence of a thermo-compression assembly/disassembly system according to the present invention.

FIG. 6 also illustrates an assembling work in Mode 6, but the thermo-compression tool is continuously heated. However, the other timings are similar to those shown in FIG. 3, and no further description is incorporated hereinbelow for avoiding repetition.

Figure 7:
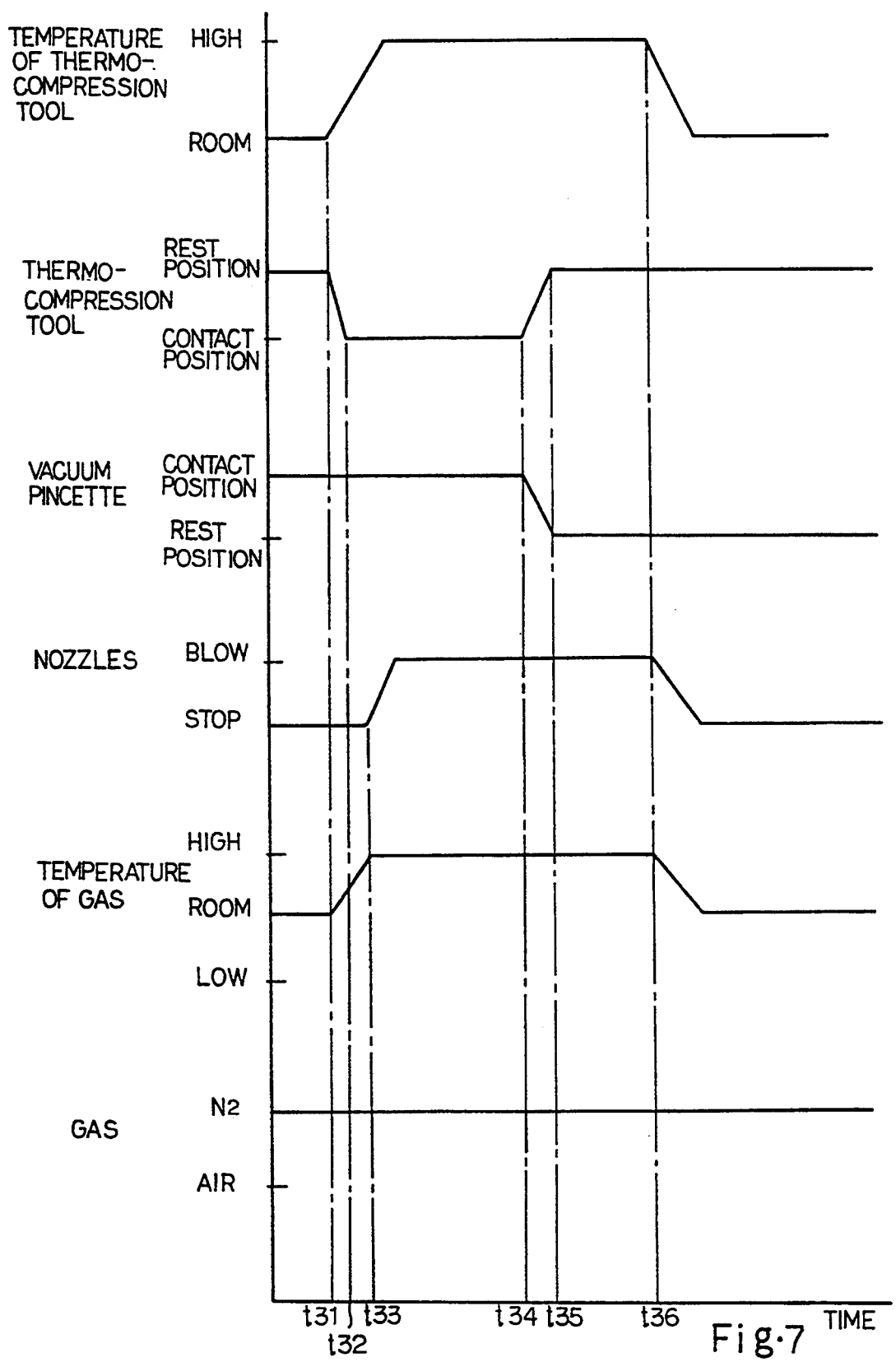
FIG. 7 is a timing chart showing a disassembling sequence of the thermo-compression assembly/disassembly system according to the present invention.

FIG. 7 illustrates a disassembling work in Mode II, and the disassembling sequence is described in detail.

Assuming now that a semiconductor integrated circuit package mounted on the rigid circuit board 2b reaches the working region 1, the vacuum pincette 3d is held in contact with the semiconductor integrated circuit package, and the controller 5a instructs the driving mechanism to downwardly move the thermo-compression tool 3 so as to be brought into contact therewith at time t31. The controller 5a further instructs the thermo-compression tool 3 to rise from room temperature to the high temperature. The thermo-compression tool 3 reaches the contact position at time t2.

The controller 5a instructs the valve unit 4n to conduct the source of nitrogen 4g through the valve unit 4k to the heating unit 4e at time t31, and the heating unit 4e heats the nitrogen gas.

If the nitrogen gas is heated over the melting point of the solder at time t33, the controller 5a instructs the nozzles 4a to 4d to blow the high-temperature nitrogen gas to the conductive leads 2c bonded to the copper pads 2d, and the solder is melted.

When the solder is melted, the controller 5a instructs the driving mechanism to lift the vacuum pincette 3d at time t34, and the melted solder allows the vacuum pincette 3d to separate the semiconductor integrated circuit package 2a from the electric/electronic circuit board 2b. The controller 5a further instructs the driving mechanism to move the thermo-compression tool 3 from the contact position to the rest position at time t34, and the thermo-compression tool 3 reaches the rest position at time t35.

While the vacuum pincette 3d is separating the semiconductor integrated circuit package 2a from the electric/electronic circuit board, the nozzles 4a to 4d are continuously blowing the high-temperature nitrogen gas to the copper pads 2d, and the solder is never set again. As a result, the conductive leads 2c and the copper pads 2d are not broken, and the semiconductor integrated circuit package 2a and the rigid circuit board 2b can be reused, if necessary. Of course, in order to use the semiconductor integrated circuit package 2a again, solder may be supplemented between the conductive leads 2c and the copper pads 2d. However, the residual solder is not oxidized in the disassembling work, and the melted solder keeps the wettability.

Finally, the controller 5a instructs the valve units 4k and 4n to block the passage from the source of nitrogen gas 4g to the heating unit 4e at time t36, and the thermo-compression tool 3 is recovered to the room temperature.

Second Embodiment

Figure 2:
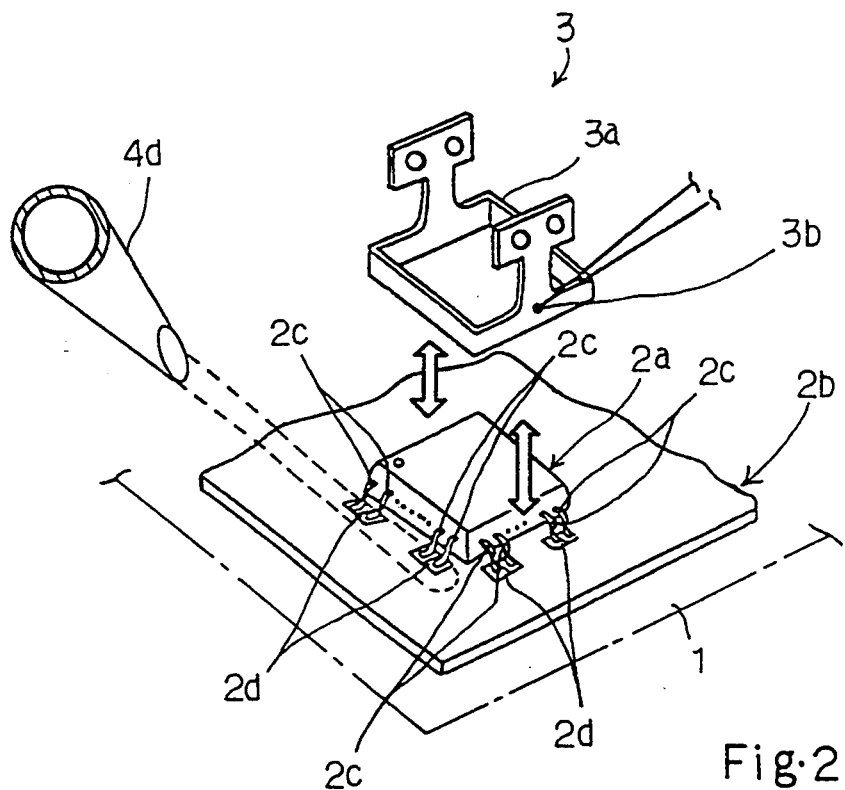
FIG. 2 is a perspective view showing a thermo-compression tool incorporated in the thermo-compression assembly/disassembly system and a semiconductor integrated circuit package on a rigid circuit board.
Figure 8:
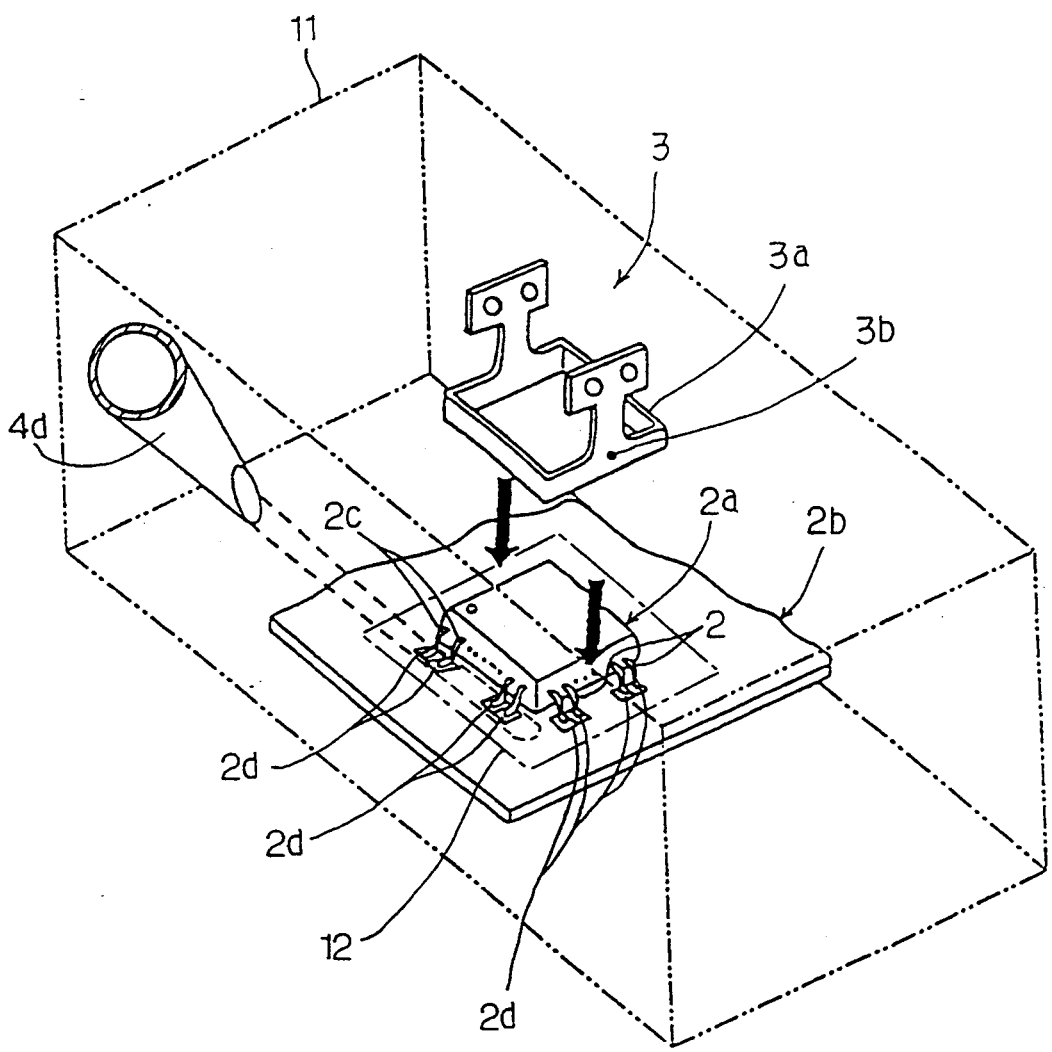
FIG. 8 is a perspective view showing the essential part of another thermo-compression assembly/disassembly system according to the present invention.

Turning to FIG. 8 of the drawings, a hood 11 is incorporated in another thermo-compression system embodying the present invention, and the hood certainly creates an inert ambience around the working area 12. The other components are similar to those of the first embodiment, and, for this reason, are labeled with the same references used in FIG. 2.

Figure 9:
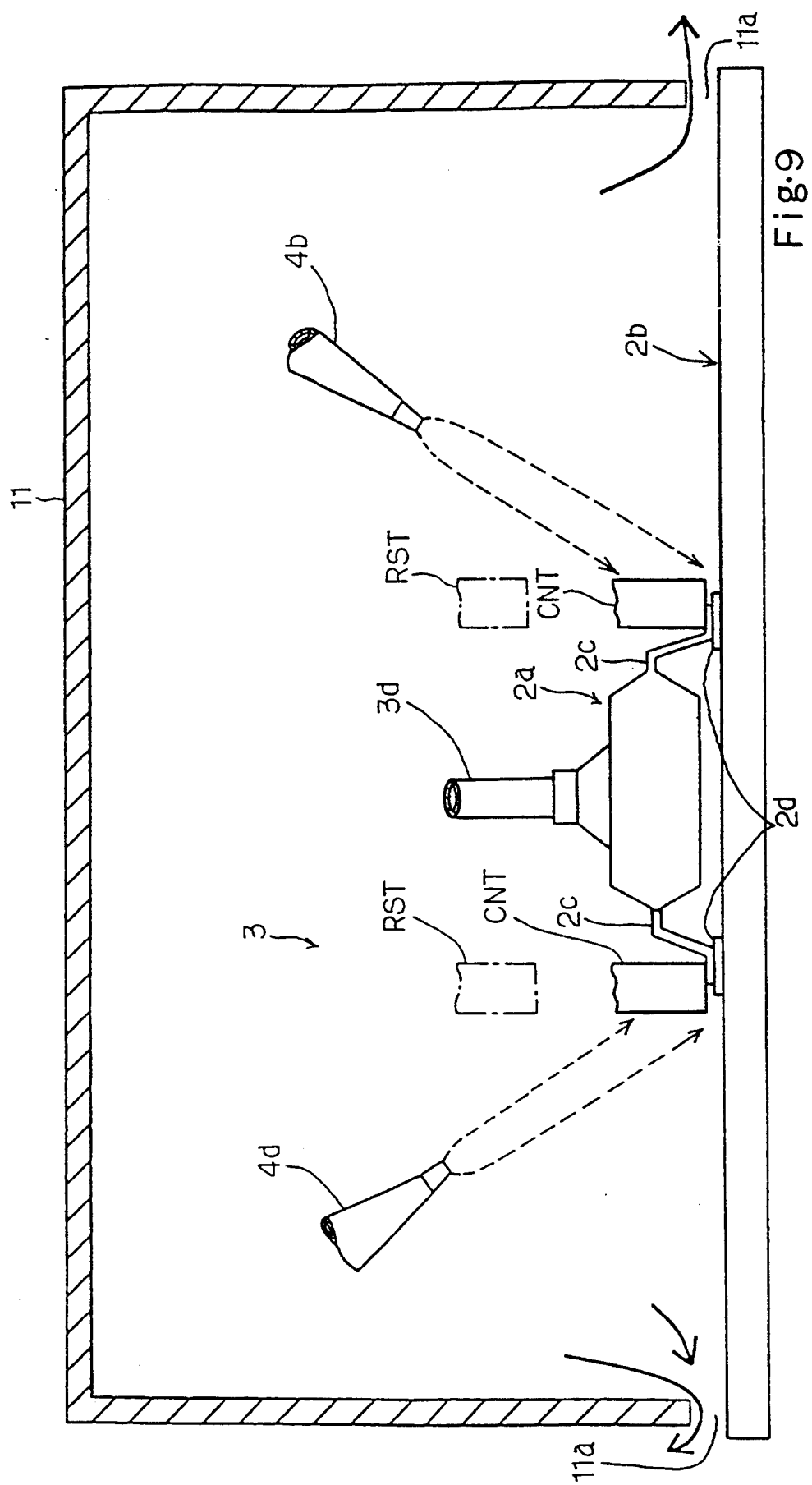
FIG. 9 is a partially cut-away view showing the inside of a hood incorporated in the thermo-compression assembly/disassembly system according to the present invention.

As will be better seen from FIG. 9, exits 11a are formed in the lower portion of the hood 11 for the air, and the nitrogen gas blown from the nozzles 4a to 4d creates nitrogen-rich ambience around the working region 12.

The nitrogen-rich ambience created in the hood 11 perfectly prevents the solder from oxidation, and all of the advantages of the first embodiment are also achieved by the second embodiment.

The hood 11 may be moved downwardly and upwardly and form a gap over the board 2a instead of the exits 11a.

Although particular embodiments of the present invention have been shown and described, it will be obvious to those skilled in the art that various changes and modifications may be made without departing from the spirit and scope of the present invention. For example, any gas or gaseous mixture is available as long as the gas prevents the fusible adhesive substance from oxidation. A suitable flux small in reduction may be mixed with the solder.

What is claimed is:

1. A thermo-compression assembly/disassembly system, which comprises:
   (a) a working region for receiving a circuit board having at least one conductive pad;
   (b) holding means for holding an electric circuit component having at least one conductive lead coated with a thermally fusible substance, the holding means being selectively moveable into the holding region for placing the at least one conductive lead of the electric circuit component into contact with the at least one conductive pad of the circuit board, and being selectively moveable out of the working region for removing the electric circuit component from the circuit board;

(c) a thermo-compression tool moveable into an out of the working region independently of the holding means for applying heat and compression to the at least one conductive lead to thereby fuse the thermally fusible substance;

(d) a plurality of nozzles arranged independently of the holding means and the thermo compression tool for selectively blowing one or both of an inert gas and air to the at least one conductive pad and at least one conductive lead in the working region;

(e) heating means for selectively heating the inert gas to a temperature greater than the melting point of the thermally fusible substance;

(f) cooling means for selectively cooling the inert gas below the melting point of the thermally fusible substance;

(g) means for supplying one or both of the inert gas and air to the plurality of nozzles; and (f) controlling means for controlling the thermo-compression tool, the holding means, the heating means, the cooling means and the supplying means to selectively assemble the electric component to the circuit board by thermally fusing the at least one conductive lead to the at least one conductive path or selectively disassemble the electric component from the circuit board by melting the thermally fusible substance after assembly of the electric component to the circuit board.

* * * * *